United States Patent
Itou et al.

(10) Patent No.: US 7,174,527 B2
(45) Date of Patent: Feb. 6, 2007

(54) LAYOUT VERIFICATION METHOD AND METHOD FOR DESIGNING SEMICONDUCTOR INTEGRATED CIRCUIT DEVICE USING THE SAME

(75) Inventors: Masanori Itou, Takatuki (JP); Kiyohito Mukai, Souraku-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/270,594

(22) Filed: Nov. 10, 2005

(65) Prior Publication Data

US 2006/0115911 A1 Jun. 1, 2006

(30) Foreign Application Priority Data

Nov. 12, 2004 (JP) .......................... P2004-329421

(51) Int. Cl.
*G06F 17/50* (2006.01)
(52) U.S. Cl. ...................................................... 716/11
(58) Field of Classification Search .................. 716/11
See application file for complete search history.

(56) References Cited

U.S. PATENT DOCUMENTS

| 6,496,959 | B1 | 12/2002 | Noguchi |
| 6,550,039 | B2 | 4/2003 | Noguchi |
| 6,862,723 | B1 | 3/2005 | Wang et al. |
| 2001/0010093 | A1 | 7/2001 | Nagayoshi et al. |

FOREIGN PATENT DOCUMENTS

| JP | 11-214521 | 8/1999 |
| JP | 2001-210716 | 8/2001 |

*Primary Examiner*—Evan Pert
(74) *Attorney, Agent, or Firm*—McDermott Will & Emery LLP

(57) ABSTRACT

To provide a layout verification method capable of accurately detecting damage to be given to a gate, and to provide a higher-workability and higher-reliability design method to accurately detect damage to be given to a gate and to determine an approach for design correction to avoid damage, the layout verification method according to the invention is characterized in that an antenna value which is an estimated value of transistor gate damage is output based on an antenna ratio, and a fluctuation of plasma charging damage due to the layout near the transistor gate.

17 Claims, 10 Drawing Sheets

LAYOUT VERIFICATION METHOD AND METHOD FOR DESIGNING SEMICONDUCTOR INTEGRATED CIRCUIT DEVICE USING THE SAME

BACKGROUND OF THE INVENTION

1. Field of the Invention

The present invention relates to a layout verification method and a method for designing a semiconductor integrated circuit device using the same, and particularly relates to a method for more properly and more accurately verifying plasma charging damage caused by an antenna effect at the time of manufacturing a semiconductor, making proper correction and designing a proper new semiconductor integrated circuit device.

2. Description of the Related Art

In recent years, in processes for manufacturing semiconductor integrated circuit devices, various plasma techniques have been used as methods for enhancing reactivity due to use of plasma so as to implement an active process while reducing the processing temperature. For example, representative ones of the techniques include dry etching at the time of patterning a wiring layer, deposition of a plasma TEOS film for forming an interlayer insulating film to be disposed between wiring layers in a multilayer wiring step, and so on. These techniques will be hereinafter referred to as "plasma step".

For example, assume that no diffusion layer is connected to metal wiring in a step of patterning a metal thin film to thereby form the metal wiring or when plasma etching is performed upon an insulating film, a conductive film or the like on the metal wiring. In this case, plasma charges are accumulated in the metal wiring so as to allow an electric current to flow into a gate oxide film of a transistor to which the metal wiring is connected. This current leads to such problems that the gate oxide film may be broken, the transistor characteristics may change due to a change in film quality of the gate oxide film, or the hot carrier life may deteriorate. Such a phenomenon is called "antenna effect". In the following description, defects caused by the antenna effect will be referred to as "antenna damage".

Such antenna damage leads to a severer problem with advance of finer process technologies. The factors thereof can be considered as follows.

First, the gate oxide film per se of the transistor becomes a thin film such that the withstand voltage of the gate oxide film is lowered significantly as compared with that in a conventional process. Incidentally, there is another opinion that when the gate oxide film is made thinner, a tunnel current in the gate oxide film grows up so that the antenna damage is rather improved. However, in current design rules, it is the that antenna rules tend to deteriorate.

Secondly, the minimum gate width is reduced with finer process technology, but the wiring length cannot be made so short in spite of the finer process technology.

Thirdly, at the time of over-etching in a dry etching step of wiring, damage caused by plasma invading from a side wall of the wiring is a principal factor of the antenna damage. In order to secure resistance to electro-migration in the wiring or suppress the resistance value, however, there is a tendency that the wiring width can be reduced but the wiring film thickness cannot be made so thin.

Further, fourthly, there is a tendency that the plasma density at the time of etching increases with a finer wiring pattern.

Due to the factors described above, an antenna ratio of about several thousands in recent fine process technologies leads to occurrence of antenna damage such as breakdown of a gate oxide film or characteristic deterioration of a transistor in the middle of a manufacturing process of an LSI designed quite commonly although an antenna ratio of about 100 thousand has not leaded to any problem in a conventional CMOS generation based on 0.8 design rules or the like. Conventionally, the "antenna ratio" generally means a ratio of an area of a conductive layer where plasma charges generated at the time of plasma etching are accumulated to an area of a gate.

From the background described above, it is necessary to verify electrostatic discharge damage more accurately and take measures against the damage independently of electrostatic protection in mounting and handling which protection has been requested to I/O terminals conventionally.

FIG. 10 shows a sectional view of a layout showing typical plasma charging damage. When an antenna is checked in layout verification in the background art, an antenna ratio which is a ratio of the area of a wiring layer 1 being produced to be connected to a gate terminal 2 of a transistor during a process for manufacturing each wiring layer to the area of the gate is output as an error only when the antenna ratio exceeds a fixed threshold value defined by manufacturing performance or the like. There is a method for avoiding plasma charging damage as follows. That is, the gate connection at the time of manufacturing the wiring is avoided by bypassing via a higher wiring layer so as to reduce the wiring area of the wiring layer which is the portion where the error has been output. Thus, the wiring layout of the portion where the error has been output is corrected (for example, see Japanese Patent Laid-Open No. 2001-210716). Alternatively, a diode is connected as a protection circuit in order to prevent plasma charging on the gate. Here, for example, a method to prepare a layout having a protection circuit and automatically add the protection circuit to wiring needing the protection circuit during automatic wiring is taken (for example, see Japanese Patent Laid-Open No. 214521/1999).

However, due to thinner thickness of gates of transistors as a result of recent finer design technologies, there has been observed a phenomenon that the effect of a diode as a protection circuit cannot be obtained sufficiently, or a phenomenon of charging up to a gate terminal from wiring connected to a source or a drain of a transistor. When such a phenomenon is reflected on the layout verification environment using computer processing, the portion where the layout should be corrected or the method to correct the layout may be not suitable only by the aforementioned output information about the site of the transistor gate having the antenna ratio exceeding the threshold value. As a result, the layout must be corrected as to all the wiring to be connected to the gate where the error is output. Thus, huge time and quantity of work are required, but the design quality also deteriorates due to excessive measures or correction.

In addition, in the background-art plasma charging damage verification, there is a problem that the verification step is so complicated that the workability deteriorates when the verification is to be performed accurately. Accordingly, in some cases, the verification method itself had better be simplified to discover problems on layout and correct the layout easily. Thus, layout verification faithful to complicated phenomena has been prevented from being put into practice.

In order to suppress difficulty of design correction caused by severer effect of plasma charging damage as described above, it is requested to obtain not only an error output but also information as some index for design correction also in the verification step.

SUMMARY OF THE INVENTION

The present invention was developed in consideration of the aforementioned situation. It is an object of the invention to provide a layout verification method capable of accurately detecting damage to be given to a gate.

It is another object of the invention to provide a higher-workability and higher-reliability design method to accurately detecting damage to be given to a gate and to determine an approach for design correction to avoid plasma charging damage.

In order to attain the foregoing objects, a layout verification method according to the invention is characterized in that an antenna value which is an estimated value of transistor gate damage is output based on an antenna ratio and a fluctuation of plasma charging damage due to a layout near the transistor gate.

That is, a ratio of the area of a wiring conductor suffering the plasma to the area of the gate, that is, an antenna ratio is obtained, and a value designating the magnitude of the plasma charging damage (hereinafter referred to as "antenna value") is further obtained accurately based on the antenna ratio and a fluctuation of the plasma charging damage due to a layout near the transistor gate. Then, layout verification is executed based on the antenna value. By use of the antenna value, deterioration analysis can be performed to extract a deteriorated component of MOS device characteristics due to the plasma charging damage. Further, the effect of the MOS device characteristic deterioration on the circuit function operation can be determined to obtain a proper portion to be corrected and a proper method to correct the portion, and evaluate the design.

That is, according to the layout verification method according to the invention, a significant value expressing the magnitude of the plasma charging damage can be output directly without using binary expression to output an error when the antenna value obtained on verification exceeds a customary threshold value and output a non-error when the antenna value does not exceed the customary threshold value.

That is, the layout verification method according to the invention is a layout verification method for verifying plasma charging damage to be given to a transistor gate due to antenna effect of a wiring conductor. The layout verification method is characterized in that damage information is obtained from layout information such as an area of the wiring conductor other than an antenna ratio which is a ratio of the area of the wiring conductor connected directly to the transistor gate to an area of the transistor gate, a value obtained by adding the damage information to the antenna ratio is set as an antenna value, and plasma charging damage to be given to the transistor gate is verified based on the antenna value.

The layout verification method according to the invention may include an antenna ratio calculation step of calculating direct damage due to propagation of the plasma over the wiring conductor connected directly to the transistor gate, in a form of an antenna ratio of the area of the wiring conductor to the area of the transistor gate, and an antenna value calculation step of outputting an antenna value which is an estimated value of transistor gate damage, based on the antenna ratio and a fluctuation of the plasma charging damage due to a layout near the transistor gate.

The layout verification method according to the invention may be adapted so that the fluctuation is dependent on indirect damage caused by propagation of the plasma to the wiring conductor connected to the transistor gate through a wiring conductor of a higher layer which is not connected directly to the transistor gate, and the antenna value calculation step is to calculate the antenna value based on the direct damage, and the indirect damage caused by propagation of the plasma to the wiring conductor connected to the transistor gate through the wiring conductor of the higher layer not connected directly to the transistor gate.

The layout verification method according to the invention may be adapted so that the fluctuation is dependent on indirect damage caused by arrival of the plasma in the lower-layer wiring conductor connected to the transistor gate, through an inter-wiring-layer insulating film when a wiring conductor of a higher layer is produced, and the antenna value calculation step is to calculate the antenna value based on the direct damage, and the indirect damage caused by arrival of the plasma from the higher layer to the lower-layer wiring conductor connected to the transistor gate.

The layout verification method according to the invention may be adapted so that the direct damage is calculated based on an antenna ratio which is a ratio of a wiring area of a higher-layer wiring connected directly to the transistor gate to an area of the transistor gate.

The layout verification method according to the invention may be adapted so that the antenna value calculation step is to calculate the antenna value based on the antenna ratio in consideration of a alleviation effect with which the antenna effect will be alleviated in accordance with a position where a diode formed out of a diffusion layer is connected to the transistor gate.

The layout verification method according to the invention may be adapted so that the antenna value calculation step is to calculate the antenna value based on the antenna ratio in consideration of a alleviation effect with which the antenna effect will be alleviated in accordance with which is formed, a diode or a substrate contact, out of a diffusion layer to which the wiring directly connected to the transistor gate in one end is connected in the other end.

The layout verification method according to the invention may be adapted so that the antenna value calculation step is to calculate the antenna value based on the antenna ratio in consideration of a fluctuation based on the antenna effect alleviation effect due to a light shielding effect of a higher-layer wiring conductor on the diode.

The layout verification method according to the invention may be adapted so that the indirect damage includes a component of an antenna effect given to a gate portion on the transistor due to a wiring conductor connected to source and drain terminals of the transistor.

The layout verification method according to the invention may be adapted so that the antenna value calculation step includes a step of calculating an antenna value in consideration of fluctuating components based on the antenna effect alleviation effect due to an area of a diffusion layer connected to the transistor gate via wiring in order to take measures against the antenna effect.

A method for designing a semiconductor integrated circuit according to the invention includes a step of reducing a result of layout verification based on the antenna value obtained in the aforementioned layout verification method, to a characteristic fluctuating value of the semiconductor integrated circuit.

A method for analyzing deterioration of a semiconductor integrated circuit according to the invention may be characterized in that deterioration information is generated from a result of verification obtained in the aforementioned layout verification method, and layout information, in consideration of a difference in deterioration characteristic depending on a kind and a shape of a device and a relationship of connection with wiring.

The method for analyzing deterioration of a semiconductor integrated circuit according to the invention may be adapted so that deterioration information is obtained from a characteristic of increase of a leak current of an MOS device with increase of the antenna value.

The method for analyzing deterioration of a semiconductor integrated circuit according to the invention may be adapted so that deterioration information is output based on a characteristic of lowering of a voltage switching speed of an MOS device with increase of the antenna value.

The method for analyzing deterioration of a semiconductor integrated circuit according to the invention may be adapted so that deterioration information is output based on a characteristic of a change in resistance value of an element suffering the plasma charging damage with increase of the antenna value.

The method for analyzing deterioration of a semiconductor integrated circuit according to the invention may be adapted so that deterioration information is output based on a characteristic of a change in capacitance value of an element suffering the plasma charging damage with increase of the antenna value.

The method for analyzing deterioration of a semiconductor integrated circuit according to the invention may be adapted so that deterioration information is output based on a characteristic of increase of probability of failure in operation due to a breakdown of a semiconductor element with increase of the antenna value.

A method for designing a semiconductor integrated circuit according to the invention is characterized in that necessity to correct a design is determined over each semiconductor function or all over one chip by comparison with performance margin in the design of each deteriorated component based on deterioration information of the semiconductor integrated circuit obtained in the aforementioned method for analyzing deterioration of a semiconductor integrated circuit.

A method for evaluating a design of a semiconductor integrated circuit according to the invention is characterized in that semiconductor integrated circuit deterioration information obtained in the aforementioned method for analyzing deterioration of a semiconductor integrated circuit is input, and validity of a method for correcting the circuit in order to ensure the performance margin of the circuit is determined over the functions of the semiconductor integrated circuit and the whole of the semiconductor integrated circuit by comparison with the performance margin in design of each input deteriorated component.

The method for evaluating a design of a semiconductor integrated circuit according to the invention may include a step of comparing a method for correcting the circuit in order to ensure the performance margin with a background-art method for correcting the circuit by layout correction, and determining which method is easy to correct.

The method for evaluating a design of a semiconductor integrated circuit according to the invention may include a step of inputting semiconductor integrated circuit deterioration information obtained in the aforementioned method for analyzing deterioration information, and analyzing operation in consideration of the deterioration information as parameters of circuit simulation.

The method for evaluating a design of a semiconductor integrated circuit according to the invention may include a step of obtaining semiconductor integrated circuit deterioration information due to plasma charging damage by the semiconductor integrated circuit deterioration analysis method based on the antenna value obtained by the layout verification and as a value expressing the plasma charging damage, and a step of determining a to-be-corrected circuit layout for the layout verification result by the aforementioned method based on the plasma charging damage semiconductor integrated circuit deterioration information.

The method for evaluating a design of a semiconductor integrated circuit according to the invention may include a step of analyzing deterioration of the semiconductor integrated circuit based on the antenna value obtained by the layout verification and as a value expressing plasma charging damage, and obtaining semiconductor integrated circuit deterioration information due to the plasma charging damage, and a step of determining a circuit correction method suitable for the layout verification result based on the plasma charging damage semiconductor integrated circuit deterioration information.

The following phenomena may be added as calculation components to a calculation equation to obtain the antenna value expressing the magnitude of the plasma charging damage so as to examine accuracy of the value.

In the background art, only the plasma charging effect from wiring directly connected to a gate terminal of a transistor, that is, only the direct damage is checked in an antenna checking step. In recent processes, however, there is observed a phenomenon that the plasma charging effect on wiring connected to the source and drain terminals of the transistor serves to charge up the gate terminal of the transistor to thereby cause damage on the gate terminal. It is therefore preferable that indirect damage on neighbor wiring due to the area of wiring connected to a diffusion layer is included as a calculation component of the antenna value.

In the background-art antenna checking step, only the area of an intended wiring layer directly connected to the gate is regarded as a target of plasma charging for each wiring layer. However, there has been observed such a phenomenon that plasma is propagated through an insulating film to a lower-layer wiring which is electrically connected directly to the gate from a higher-layer wiring which is not electrically connected directly to the gate in a step of manufacturing the higher-layer wiring. It is therefore preferable that a component of the antenna effect extracted from the relationship between the higher-layer and lower-layer wirings is included as a component of calculation of the antenna value.

In the background-art antenna checking step, only the area of a to-be-verified wiring layer directly connected to the gate is regarded as a target of plasma charging for each wiring layer. However, there has been observed such a phenomenon that plasma arrives through an insulating film to a lower-layer wiring which is electrically connected directly to the gate from a higher-layer wiring in a step of manufacturing the higher-layer wiring. It is therefore preferable that a component of the antenna effect extracted from the relationship between the higher and lower wiring layers is included as a component of calculation of the antenna value.

Further, in the background-art antenna checking step, when a diode or the like is inserted as a protection component, it is judged whether the diode is connected or not, and the effect of the diode to alleviate the plasma charging effect is handled uniformly. However, it is preferable that the antenna effect alleviation effect as a phenomenon is handled in accordance with the connection state of a diffusion layer to be connected. For example, the phenomenon suffers the following parameters.

First, when the diffusion layer to be connected has a large area, plasma charging from wiring is apt to flow through the diffusion layer. It is therefore considered that the damage on the gate portion is generally reduced. Accordingly, it is preferable to provide a calculation method in which the effect to alleviate the plasma charging damage is changed in accordance with the area of the connected diffusion layer with respect to a wiring layer.

Secondly, diffusion layers to be connected can be categorized by types of well and diffusion, that is, categorized into a substrate contact, a pn-type diode and an np-type diode. Not to say, the easiness for a plasma charging current to pass in a wiring manufacturing step changes in accordance with the kind of diffusion layer. It is therefore preferable to provide a calculation method in which the effect to alleviate the plasma charging damage on the gate is changed in accordance with the kind of diffusion layer. Particularly it is desired to change the alleviation effect in accordance with whether the diffusion layer has a contact structure due to identical conductive types of its well and diffusion or a junction of different conductive types.

Thirdly, in the connected pn-type or np-type diode, assume that sufficient light is incident on the junction portion of the diode from above in the plasma step. In this case, the diode has a two-way electric continuity state. Thus, a high effect to alleviate the plasma charging damage can be obtained. However, when the light is blocked by a wiring layer above the diode so that the light cannot reach the diode, the diode acts as a rectifier device in itself. Thus, the effect to alleviate the plasma charging damage is reduced. It is preferable to provide a calculation method in which the effect to alleviate the plasma charging damage is changed in accordance with such a light blocking effect of a wiring layer above the diode.

Fourthly, in the connected diffusion layer, due to the connection position of the diffusion layer, plasma charges from wiring prior to the diode with respect to the gate is apt to flow into the diode, while plasma charges from wiring between the gate and the diode is apt to flow into both the gate and the diffusion layer. It is preferable to provide a calculation method in which the effect to alleviate the plasma charging damage is changed in accordance with such a connection position relationship between the gate and the diode.

The aforementioned antenna value calculation method according to the invention is not limited to mask layout verification. It is desired that the same calculation method as that for the mask layout verification is used for mask layout design.

The deterioration analysis step according to the invention may output information values including the following item contents as deterioration information to be used in the aforementioned design method based on the antenna value obtained by the layout verification step.

First, the operating effect of the damage corresponding to the obtained antenna value changes in accordance with the kind of semiconductor element using the corresponding gate portion. It is therefore preferable to perform analysis while switching between different antenna-value to deterioration-information characteristics in accordance with identification information of the semiconductor element extracted separately from the same layout. The antenna-value to deterioration-information characteristics are prepared for semiconductor elements individually.

Secondly, it has been observed that when a gate insulating film of a transistor suffers plasma charging damage, the leak current value in the transistor increases as the plasma charge damage increases. It is therefore preferable that the increase of the leak current can be output as deterioration information in the deterioration analysis step.

Thirdly, it has been observed that when a gate insulating film of a transistor suffers plasma charging damage, the switching speed in the transistor decreases as the plasma charge damage increases. It is therefore preferable that the lowering of the switching speed can be output as deterioration information in the deterioration analysis step.

Fourthly, when a gate insulating film of a transistor suffers plasma charging damage, the resistance value of the gate serving as wiring fluctuates. This influences the operation of the device itself suffering the plasma charging damage and a device connected to the gate portion. It is therefore preferable that the change of the gate resistance value can be output as deterioration information in the deterioration analysis step.

In addition, it is preferable that the state of deterioration regarded as device breakdown when the deterioration is out of a fixed range can be output in the deterioration analysis step in consideration of parts or all of the kind of device, the leak current, the switching speed and the resistance value. As a result, distinction between error and non-error in the background-art antenna checking step can be obtained and handled with higher accuracy. Thus, a point where deterioration is acute can be regarded as necessary to correct in an earlier stage bypassing the design evaluation step.

In the design evaluation step according to the invention, the following methods may be used to obtain a more proper portion whose layout should be corrected and a method to correct the layout, in accordance with a phenomenon of plasma charging damage based on the deterioration information obtained in the deterioration analysis step.

First, an operation performance margin of an intended circuit is compared with the deterioration information. When it is concluded that a sufficient operation margin is secured relatively to the deterioration, the corresponding portion is regarded as unnecessary to correct.

Secondly, an operation performance margin of an intended circuit is compared with the deterioration information. The operation performance margin of the corresponding semiconductor element is secured in accordance with the shortage of the margin. Thus, the validity of a method to take measures against performance deterioration due to the plasma charging is judged.

Thirdly, an operation performance margin of an intended circuit is compared with the deterioration information. A correction method to secure the operation performance margin and background-art measures based on wiring correction in a mask layout or expansion of a alleviation effect due to addition of a diode are judged and selected from the point of view of easiness to correct the design.

In addition, in the comparison of the operation performance margin of an intended circuit with the deterioration information, it is preferable to take a method in which an operation simulation is performed for each function or all over one chip using device performance parameters after deterioration based on plasma charging damage obtained by reflecting the deterioration information obtained in the deterioration analysis step on performance parameters of each device so that the operation on the completed-product level can be verified.

According to the invention, information obtained from layout verification can be reduced to a form capable of being used for evaluating the layout design. The influence of plasma charging damage in the operation of a semiconductor as a completed product is evaluated. Thus, a portion whose design should be corrected can be extracted with higher accuracy. In addition, a new correction method is provided in addition to a background-art method so that a proper method can be selected therefrom. Thus, a semiconductor can be designed more efficiently and with higher quality than in the background art.

Further, the result is output and used as an index of the influence on the circuit operation so that an antenna value to be output in the verification step can be also obtained accurately. Thus, a plasma charging verification method in a model closer to a real phenomenon can be put into practice.

Further, when this method is used for evaluating the design, a design method having a large plasma charging damage influence can be provided. Thus, such a structure having a large plasma charging damage influence can be improved or avoided in design. There is an effect that a design method in consideration of plasma charging can be taken also in the initial design step.

BRIEF DESCRIPTION OF THE EMBODIMENTS

An embodiment of the invention will be described below. Not to say, the invention is not limited to the embodiment which will be described below.

Figure 1:
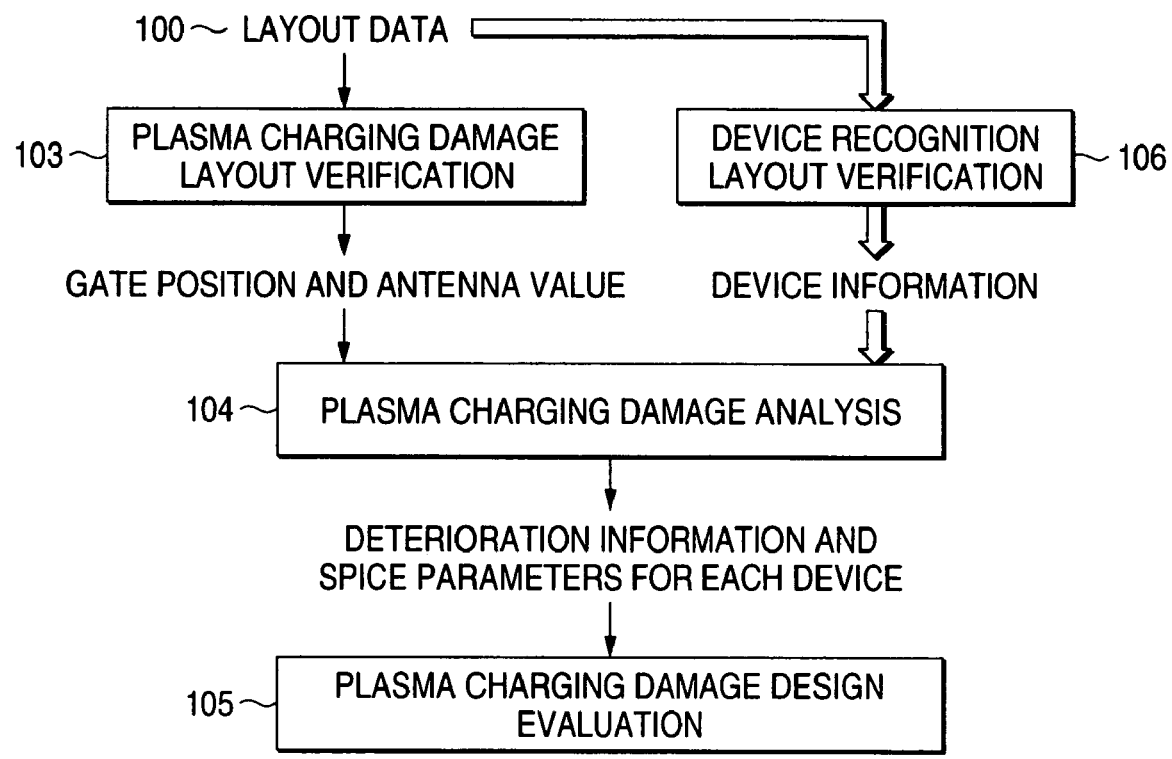
FIG. 1 is a schematic block diagram of a method for analyzing plasma charging damage according to an embodiment
Figure 2:
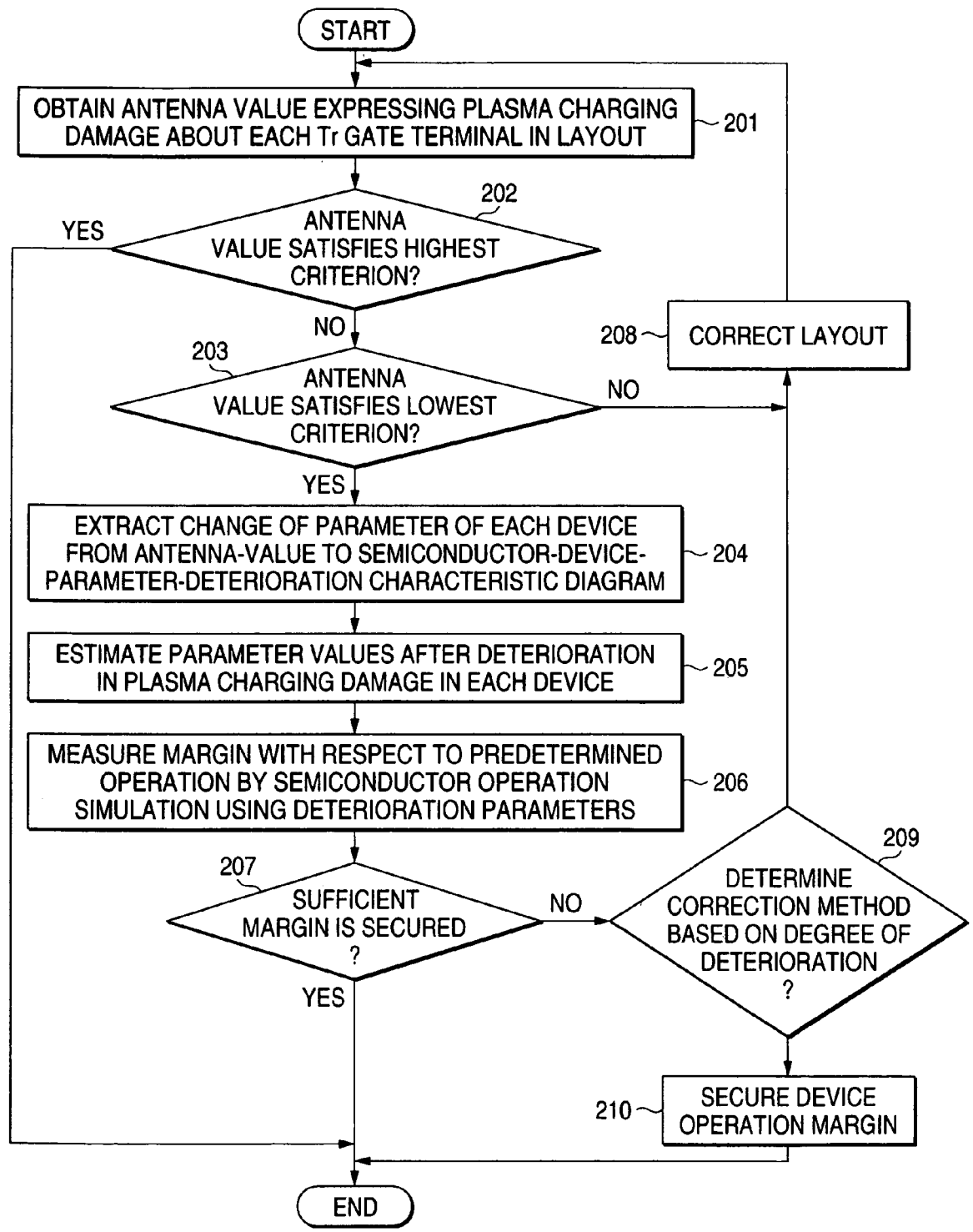
FIG. 2 is a flow chart of the method for analyzing plasma charging damage according to the invention.

FIG. 1 shows a schematic block diagram showing a method for analyzing plasma charging damage according to the invention. FIG. 2 shows a flow charge of analysis using this analysis method.

As shown in FIG. 1, a plasma charging verification step 103 according to the embodiment is characterized in that an antenna value expressing the magnitude of the plasma charging damage is obtained with higher accuracy based on an antenna ratio which is a ratio of an area of a conductor connected to a transistor gate and suffering plasma to an area of the gate, and a fluctuation of the plasma charging damage due to a layout state including the layout near the transistor gate, and layout verification is executed based on the obtained antenna value. The plasma charging verification step 103 is characterized by including an input unit for inputting layout data 100 and an output unit for outputting the coordinates of the transistor gate and the antenna value in each wiring layer manufacturing step, so as to calculate the gate position coordinates and the antenna value based on the layout data 100. Here, layout verification (step 106) is carried out to recognize a device from the layout data 100, and device information is output in advance.

The plasma charging damage is analyzed based on the gate position coordinates, the antenna value and the device information (Step 104).

Deterioration information of each device is obtained from data of the aforementioned analysis, and an arithmetical operation is performed with the deterioration information as SPICE (Software Process Improvement and Capability Determination) parameters so as to perform design evaluation in consideration of the plasma charging damage (Step 105).

Figure 3:
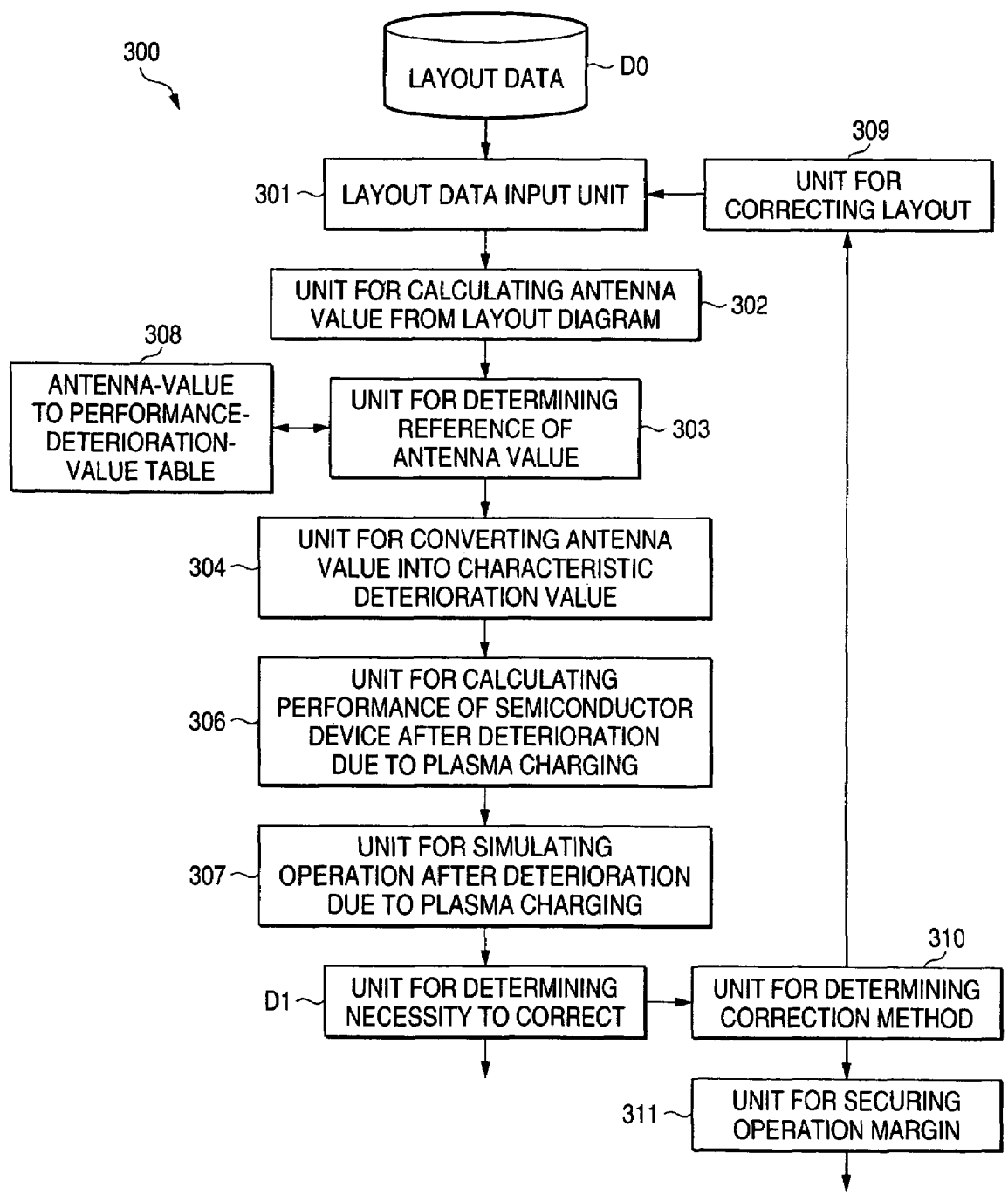
FIG. 3 is a configuration diagram of a mask layout design apparatus using the method for analyzing plasma charging damage according to the invention.

A semiconductor integrated circuit is designed by use of this layout verification method along a flow chart as shown in FIG. 2 and by use of a mask layout design apparatus in FIG. 3. FIG. 3 is a block diagram of the mask layout design apparatus.

First, description will be made about the mask layout design apparatus. The mask layout design apparatus 300 outputs layout data D1 obtained by applying measures against plasma charging damage to layout data D0 as shown in FIG. 3. The reference numeral 308 represents an antenna-value to performance-deterioration-value table. Arithmetic operations are performed with reference to this table.

The mask layout design apparatus 300 is characterized by including a layout data input unit 301 for inputting the layout data D0, an antenna value calculation unit 302 for calculating an antenna value from input layout information as will be described later, a reference determination unit 303 for determining the antenna value based on predetermined antenna value criteria, an antenna-value to characteristic-deterioration-value conversion unit 304 for converting the antenna value into a characteristic deterioration value with reference to the antenna-value to performance-deterioration-value table 308, an operation simulation unit 306 for simulating an operation after deterioration due to plasma charging, a correction necessity determination unit 307 for determining necessity to correct, a correction method determination unit 310 and a layout correction unit 309. If layout data needs layout correction, layout correction will be performed by the layout correction unit 309. If layout correction is not required but only an operation margin is to be secured, the operation margin will be adjusted by an operation margin securing unit 311. The mask layout design apparatus 300 is characterized in that when layout data needs to be corrected, the correction method determination unit 310 determines a correction method, and in accordance with the result of the determination, layout correction is performed by the layout correction unit 309 or the layout data is corrected to secure the operation margin by the operation margin securing unit 311.

Next, a design method using the mask layout design apparatus will be described with reference to the flow chart shown in FIG. 2.

First, an antenna value expressing plasma charging damage is obtained for each transistor gate terminal based on the layout information (Step 201).

It is determined whether the antenna value satisfies the highest criterion or not (Step 202). When the antenna value does not satisfy the highest criterion, it is determined whether the antenna value satisfies the lowest criterion or not (Step 203).

When it is concluded in Determination Step 203 that the antenna value satisfies the lowest criterion, parameter fluctuations of each device are extracted based on the antenna value and the deterioration characteristics of the semiconductor integrated circuit parameters as will be described later (Step 204).

Parameter values after deterioration due to plasma charging damage in each device are estimated (Step 205).

Further, a margin for a predetermined operation is measured by a semiconductor operation simulation using the deteriorated parameters (Step 206).

It is determined whether the margin is secured sufficiently or not, and the routine of processing is terminated when it is concluded that the margin is secured (Step 207).

On the other hand, when it is concluded in Determination Step 203 that the antenna value does not satisfy the lowest criterion, the routine of processing proceeds to layout correction (Step 208) and then returns to the step of obtaining the antenna value again (Step 201).

When it is concluded in Determination Step 207 that the margin is not secured sufficiently, a correction method is determined based on the degree of deterioration (Step 209).

In accordance with the correction method determined in Step 209, the device operation margin is secured (Step 210) and then the routine of processing is terminated, or the routine of processing proceeds to layout correction (Step 208) and then returns to the step of obtaining the antenna value again (Step 201).

Next, description will be made on calculation of the antenna value.

In Plasma Charging Damage Verification Step 103, when Mx designates an x-th wiring layer from the bottom layer, the basic equation to calculate the antenna value at the time of generation of the wiring layer Mx is expressed by:

antenna value=$\{K_1 \times \text{AREA}(Mx)\}/\text{AREA(Gate)}$ in which $K_1$ designates a coefficient to be varied in accordance with conditions of connection of a diffusion layer, and AREA designates an area of a corresponding layout on the same connection.

Figure 4:
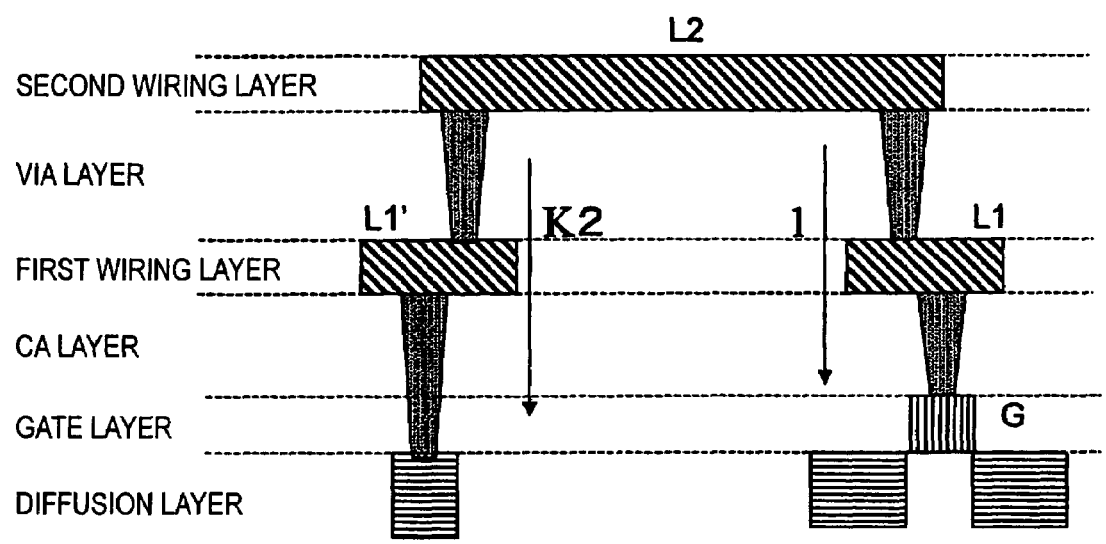
FIG. 4 is a schematic diagram of a plasma charging damage alleviation effect when a diffusion layer is connected.

When a gate G is connected to a diffusion layer D through wiring layers L1, L2 and L1' as shown in FIG. 4, plasma charging damage at the time of generation of the layer M2 and higher layers suffers a alleviation effect due to the connection of the diffusion layer. When this alleviation effect is applied to the aforementioned antenna value calculation equation, the coefficient $K_1$ can be expressed by:

$K_1 = \text{AREA(Gate)}/\{K_2 \times \text{AREA(Diode)} + \text{AREA(Gate)}\}$ in which $K_2$ designates a ratio of a current flowing into the gate to that into the diffusion layer due to plasma charging with respect to the corresponding area.

Figure 5A:
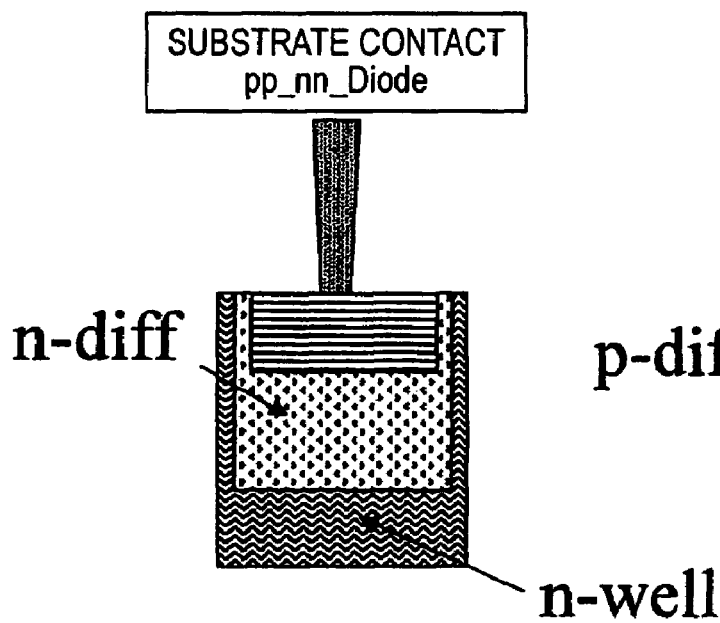
FIGS. 5A–5D are views showing kinds of diffusion layers having the plasma charging damage alleviation effect.
Figure 5C:
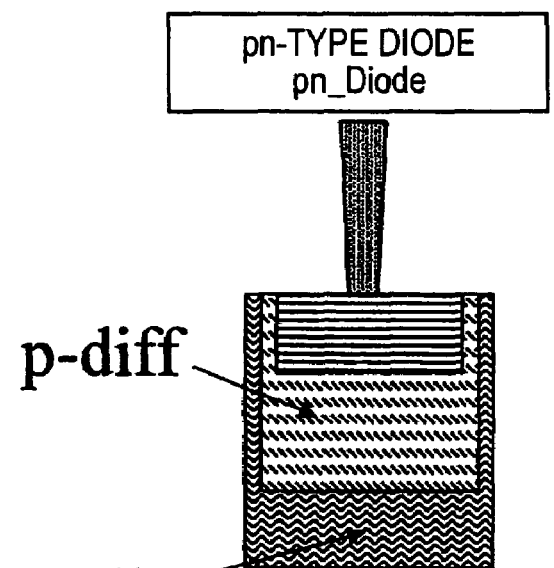
Figure 5B:
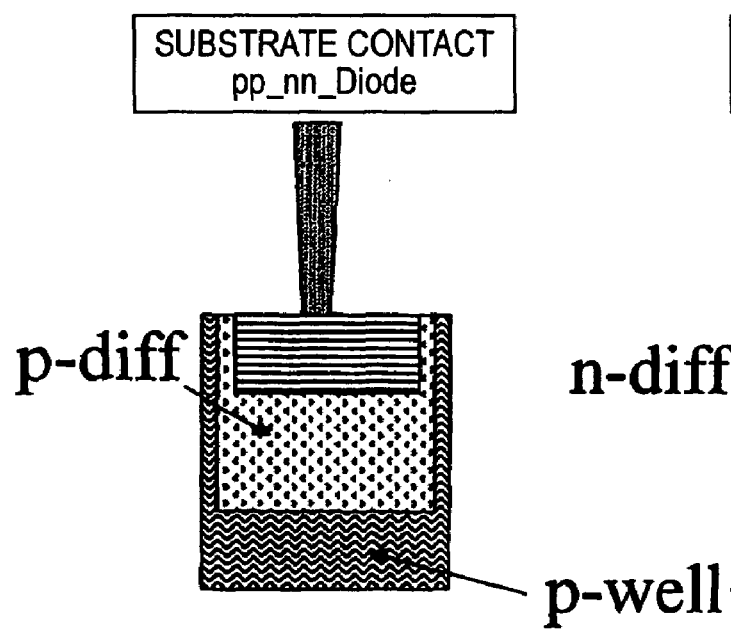
Figure 5D:
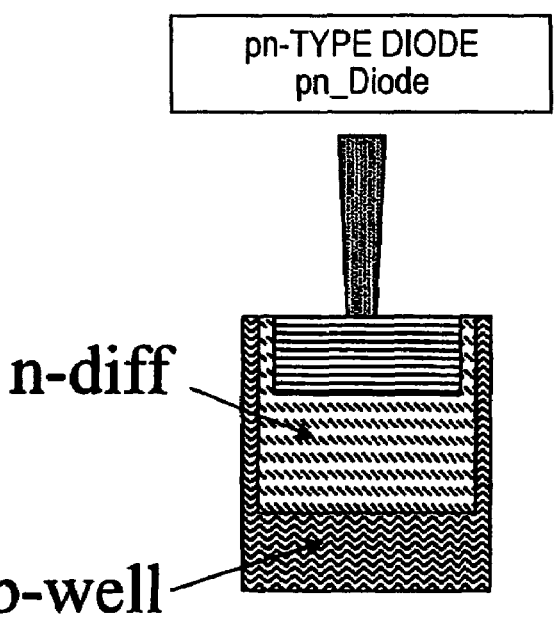

As shown in FIGS. 5A–5D, the diffusion layer formed on the substrate surface forms either a contact or a diode in accordance with the diffusion type and the well type. The substrate contact is formed as a pp type or an nn type as shown in FIG. 5A or 5B, and the diode is formed as a pn type or an np type as shown in FIG. 5C or 5D.

From the point of view of the plasma charging damage alleviation effect, electric continuity to the well is ensured in a substrate contact in which the diffusion type and the well type coincide with each other. Thus, the effect of such a diffusion layer as a shunt line of plasma increases as compared with those of diffusion layers forming pn-type and np-type diodes.

When a difference in plasma charging damage alleviation effect in accordance with the kind of diffusion layer is applied to the diffusion layer portion of the aforementioned antenna value calculation equation, the following expression can be established:

AREA(Diode)=AREA(pp nn Diode)+$K_3 \times$AREA(pn Diode)+$K_4 \times$AREA(np Diode)

in which pp nn Diode designates a substrate contact, and $K_3$ and $K_4$ designate ratios of the magnitudes of the plasma charging damage alleviation effects of the pn-type and np-type diodes to that of the substrate contact with respect to the corresponding area respectively.

In such a manner, the effect in accordance with the difference in alleviation effect can be detected with good workability.

Figure 6:
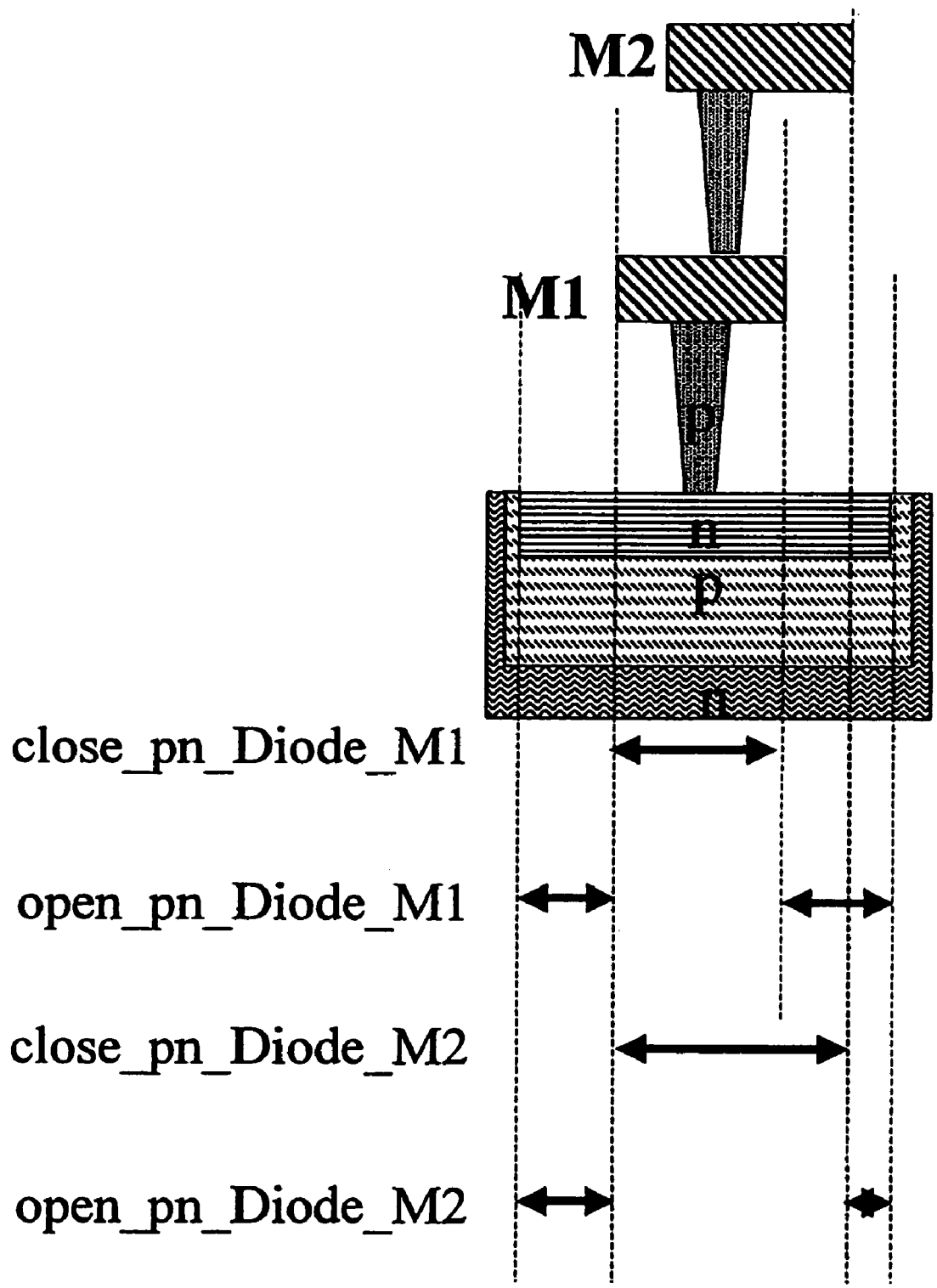
FIG. 6 is a view showing the outline of graphic operation in calculation of an antenna value of a light shielding effect due to wiring of a diffusion layer.

On the other hand, as shown in FIG. 6, when there is a wiring layer above the connected pn-type and np-type diodes, the plasma charging damage alleviation effect of the diffusion layer fluctuates due to the shielding effect.

Here, by graphic operation in the layout diagram in which the diffusion layer and the wiring layers are observed from above, diode areas covered with the wiring layers at the time of manufacturing of the wiring layer Mx are regarded as:

close pn Diode Mx=pn Diode−M1−M2 . . . −Mx close np Diode Mx=np Diode−M1−M2. . . −Mx and diode areas covered with no wiring layer at the time of manufacturing of the wiring layer Mx are regarded as:

open n Diode Mx=pn Diode−close pn Diode Mx open p Diode Mx=np Diode−close np Diode Mx in which the operator "−" means a graphic operation to exclude an overlapping portion in the layout observed from above.

In this case, the pn-type and np-type diodes in the antenna calculation equation can be expressed by:

AREA(pn Diode)=AREA(open pn Diode Mx)+$K_6 \times$ AREA(close pn Diode Mx)

AREA(np Diode)=AREA(open np Diode Mx)+$K_7 \times$ AREA(close np Diode Mx)

in which $K_6$ and $K_7$ designate rates of decreases of the plasma charging damage alleviation effect due to the wiring shielding effects of the diodes respectively.

The aforementioned expressions are summarized in the antenna calculation equation as:

$K_1$=AREA(Gate)/[$K_2 \times$\{AREA(pp nn Diode)+$K_3$ (AREA(open pn Diode Mx)+$K_6 \times$AREA(close pn Diode Mx))+$K_4 \times$(AREA(open np Diode Mx)+$K_7 \times$AREA(close np Diode Mx))\}+AREA (Gate)]

This is a coefficient in consideration of the area and kind of the connected diffusion layer and the shielding effect of the higher-layer wirings.

Figure 7:
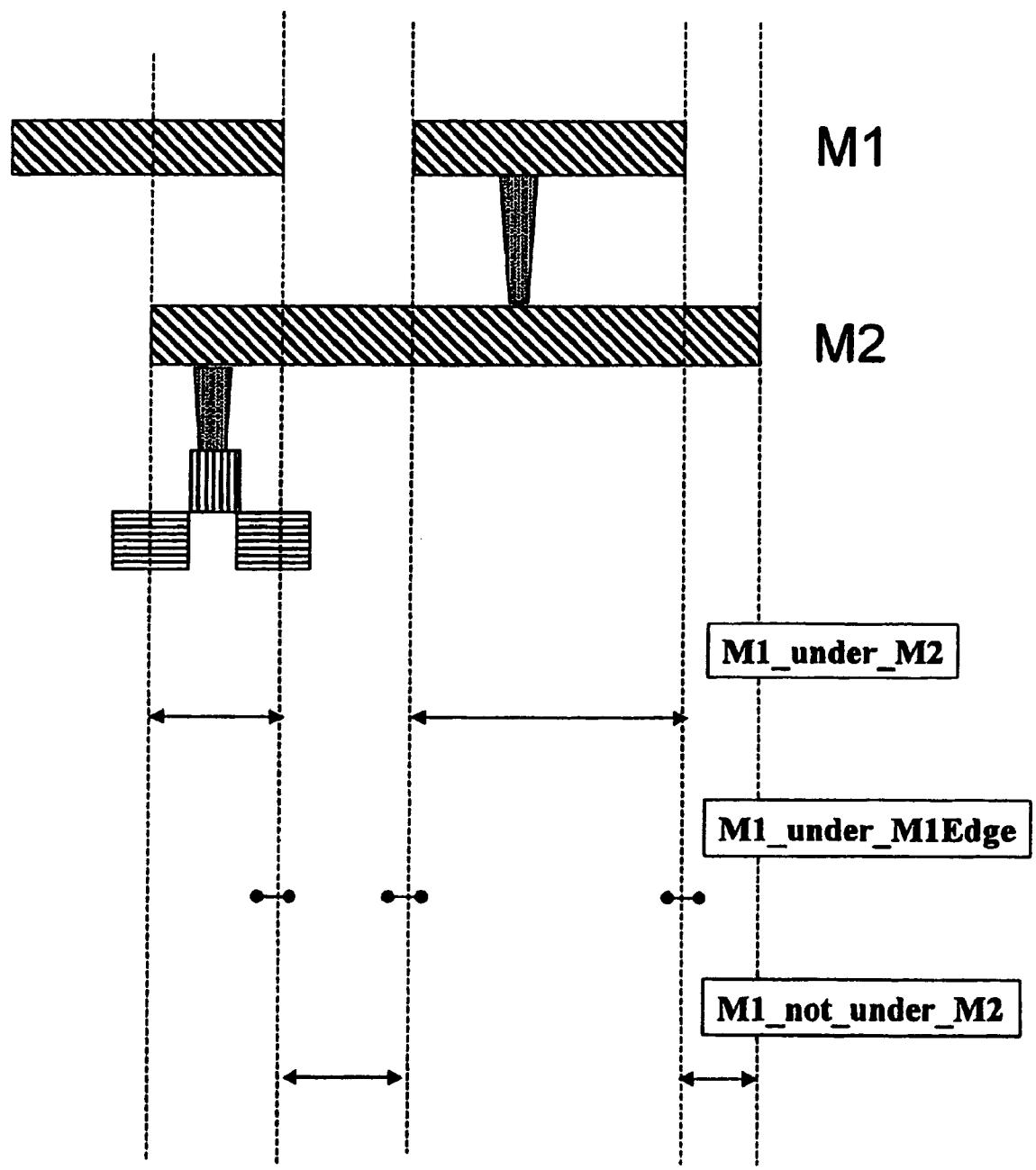
FIG. 7 is a view showing the outline of graphic operation in calculation of an antenna value of three-dimensional wiring through an inter-wiring-layer film.

As shown in FIG. 7, there occurs plasma charging to the layer Mx−1 not through a VIA but through an inter-wiring-layer insulating film at the time of generation of the layer Mx.

Here, the state of the layer Mx−1 at the time of generation of the layer Mx is classified into:

Mx−1 under Mx=Mx−1×Mx

Mx−1 under MxEdge=Mx−1×MxEdge

Mx−1 not under Mx=Mx−1−Mx−1 under Mx in which the operator "x" means a portion where the layer before the operator and the layer after the operator overlap each other. In this case, the metal area portion in the antenna calculation equation can be rewritten as:

AREA(Mx)=AREA(Mx)+$K_8$AREA(Mx−1 under Mx)+$K_9$AREA(Mx−1 under MxEdge)+$K_{10}$AREA(Mx−1 not under Mx)

The Tr gate portion suffers plasma charging damage not only from a wiring portion directly connected thereto but also from long wiring portions connected to Tr source and drain terminals.

When the area of wiring connected to the source and the drain is AREA (Mx 0D), this means that the antenna calculation equation should be rewritten as:

antenna value={$K_1$'×AREA(Mx)}/AREA(Gate)+{$K_2$'×AREA(Mx 0D)}/AREA(Gate)

in which $K_1$' and AREA (Mx 0D) can include components described in the aforementioned $K_1$ and AREA (Mx).

Figure 8:
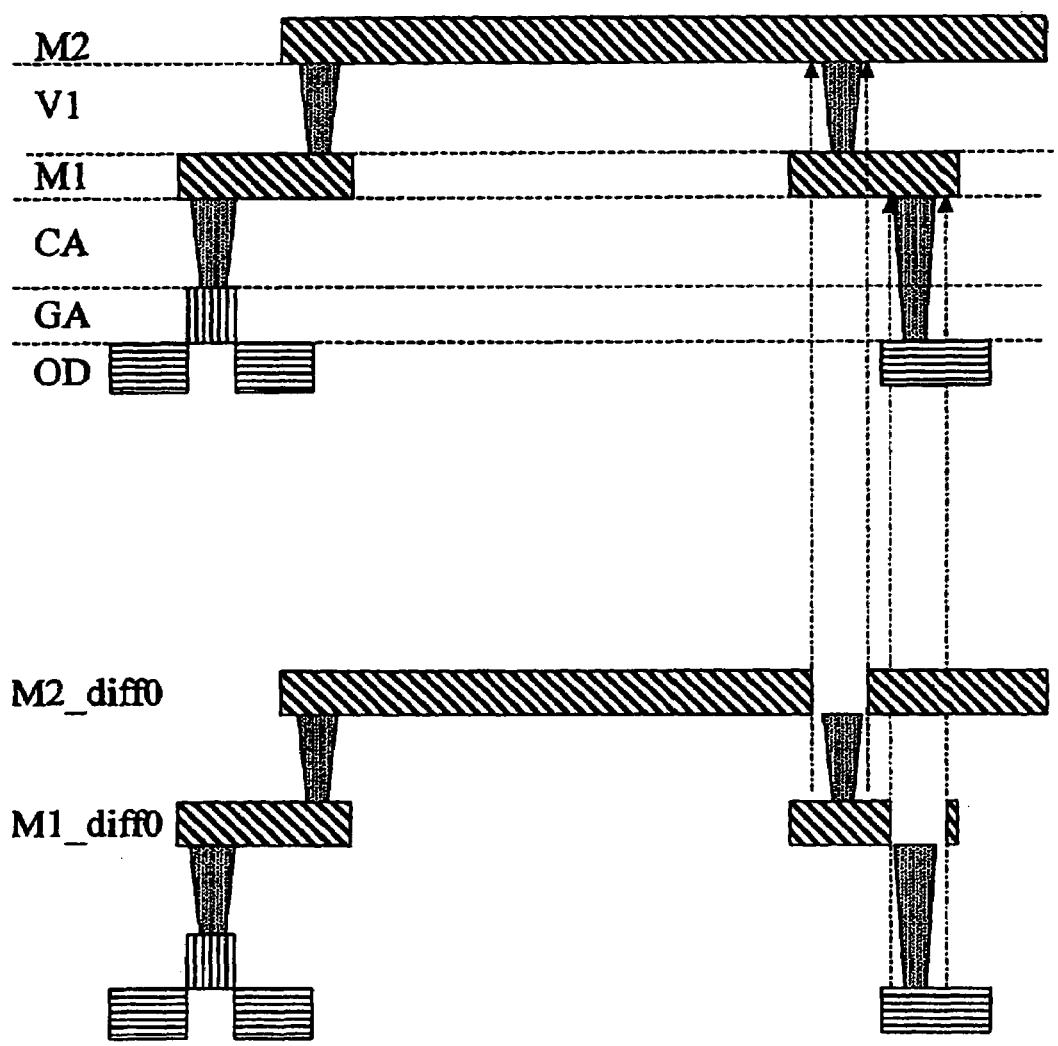
FIG. 8 is a view showing the outline of graphic operation and connection in calculation of an antenna value in consideration of the position where the diffusion layer is connected.

As shown in FIG. 8, when a large-area layer Mx is connected to the Tr gate and the diffusion layer, a gate inflow rate of plasma charging varies in accordance with the connection position of the layer Mx. Therefore, when the layer Mx is cut off virtually in a VIA position where the layer Mx is connected to the diffusion layer, assume that Mx diff0 is defined as:

Mx diff0=Mx−0D connected VIA portion on Mx

In this case, Mx_diff0 can be regarded as a portion having a large influence on plasma charging on the gate portion.

For layout verification, the wiring layer Mx is not used but Mx_diff0 is used in place of the wiring layer so as to remake connection. Thus, only the wiring to the diffusion layer closest to the gate is connected Therefore, a calculation equation in consideration of the diffusion layer connection position can be obtained by adding:

+{$K_{11}$×AREA(Mx diff0)}÷AREA(Gate)

as an additional antenna value to the basic equation of the antenna calculation equation.

Figure 9:
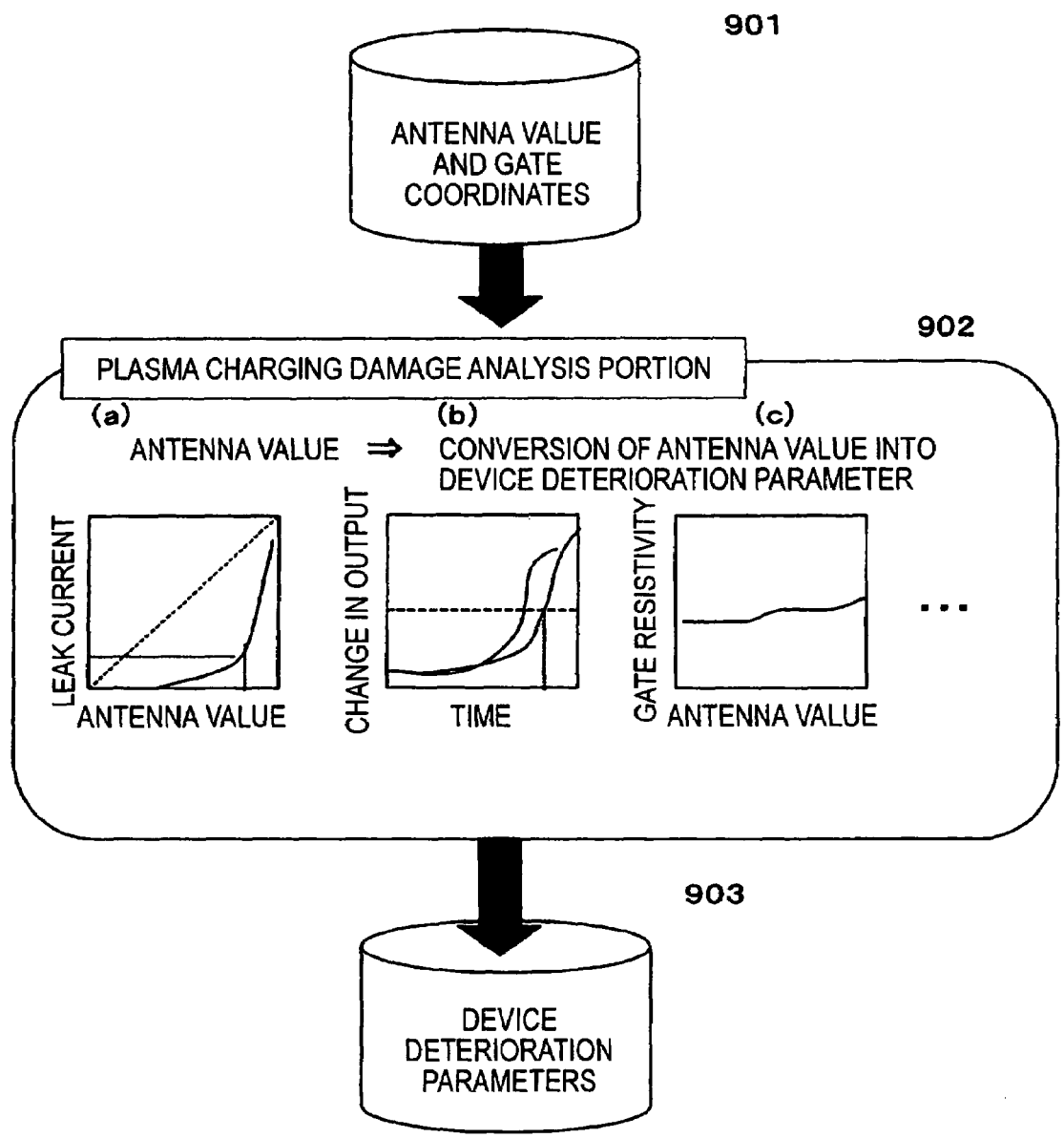
FIG. 9 is a diagram showing a process of data conversion in a plasma charging damage analysis step.
Figure 10:
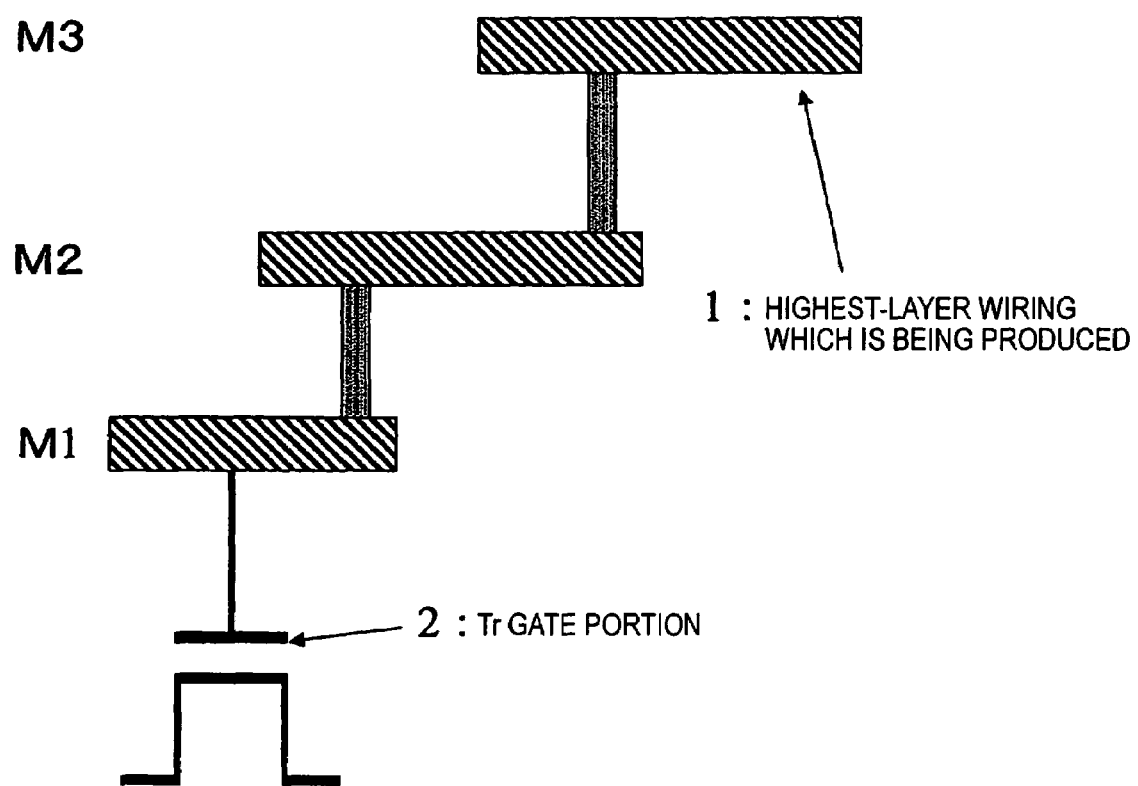
FIG. 10 is a view showing a phenomenon of plasma charging damage.

In the plasma charging damage analysis step 104 shown in FIG. 1, an antenna value 901 output from the aforementioned plasma charging damage verification step 102 is input and compared with an antenna-value to device-deterioration-characteristic diagram for each device separately obtained from process performance in a plasma charging damage analysis portion 902 as shown in FIG. 9. Thus, a leak current increase and an operation delay time are output as values of quantities of device deterioration due to plasma charging damage in the form of device deterioration parameters 903. Here, in FIG. 9, the graph (a) designates a result of measurement of the relationship between the leak current and the antenna value, the graph (b) designates a result of measurement of a change of the relationship between the time and the output change due to the antenna value, and the graph (c) designates a result of measurement of the relationship between the gate resistivity and the antenna value. In such manner, various changes can be read with respect to the antenna value.

The obtained values of the device deterioration quantities are reflected on original SPICE parameters of an intended device. Thus, estimated values of deteriorated parameters of the device having suffered plasma charging are obtained.

In the plasma charging damage design evaluation step 105 shown in FIG. 1, the aforementioned estimated values of the deteriorated parameters are input, and operation simulation is carried out on a one-chip level using the deteriorated data. Thus, the operation on a completed product level can be evaluated.

When an operation margin reliable on the product level is verified on a specified operation by the operation simulation, it is concluded that it is unnecessary to correct the layout. When the reliable operation margin is insufficient, the operation margin for the corresponding device can be corrected by compensation if the insufficiency is slight. However, when the reliable operation margin is insufficient, when the insufficiency is large, it is necessary to reduce the antenna value itself. Thus, it is necessary to change the wiring layout.

For example, assume that a value of an operation delay of a transistor due to plasma charging damage is obtained as a device deterioration quantity. In this case, the value is added to input delay information as to the transistor on the circuit diagram, and timing verification is carried out using that information in the same manner as at the time of design. Thus, the operation after deterioration due to the plasma charging damage can be verified.

At that time, severe conditions can be set in a line such as a clock line also as to correction conditions when the timing conditions of the line are severe.

A layout verification method according to the invention includes a step of reducing plasma charging damage to a form capable of being used for evaluation of the design of a layout based on information obtained by verifying the plasma charging damage from layout information. According to the layout verification method, there is an effect that a semiconductor can be designed efficiently and with high quality in the semiconductor industry due to evaluation of influence of the plasma charging damage in operation of the semiconductor as a completed product. Thus, the layout verification method is useful as measures against deterioration of the yield in micro-process technologies.

What is claimed is:

1. A layout verification method for verifying plasma charging damage to be given to a transistor gate due to antenna effect of a wiring conductor, wherein:

damage information is obtained from layout information other than an antenna ratio which is a ratio of an area of the wiring conductor connected directly to the transistor gate to an area of the transistor gate, and a value obtained by adding the damage information to the antenna ratio is set as an antenna value; and plasma charging damage to be given to the transistor gate is verified based on the antenna value.

2. The layout verification method according to claim 1, comprising:

an antenna ratio calculation step of calculating direct damage due to propagation of the plasma over the wiring conductor connected directly to the transistor gate, in a form of an antenna ratio of the area of the wiring conductor to the area of the transistor gate; and an antenna value calculation step of outputting an antenna value which is an estimated value of transistor gate damage, based on the antenna ratio and a fluctuation of the plasma charging damage due to a layout near the transistor gate and the wiring conductor connected directly thereto.

3. The layout verification method according to claim 2, wherein:

the fluctuation is dependent on indirect damage caused by propagation of the plasma to the wiring conductor connected to the transistor gate from a wiring conductor arrangement region of a higher layer which is not connected directly to the transistor gate; and the antenna value calculation step is to calculate the antenna value based on:

the direct damage; and the indirect damage caused by propagation of the plasma to the wiring conductor connected to the transistor gate from the wiring conductor of the higher layer not connected directly to the transistor gate.

4. The layout verification method according to claim 2, wherein:

the fluctuation is dependent on indirect damage caused by arrival of the plasma from a wiring conductor arrangement region or a wiring conductor non-arrangement region of a higher wiring layer to the wiring conductor connected to the transistor gate, through an inter-wiring-layer insulating film; and the antenna value calculation step is to calculate the antenna value based on:

the direct damage; and the indirect damage caused by arrival of the plasma from the higher wiring layer to the wiring conductor connected to the transistor gate, through the inter-wiring-layer insulating film.

5. The layout verification method according to claim 2, wherein:

the direct damage is calculated based on an antenna ratio which is a ratio of a wiring area of a higher-layer wiring connected directly to the transistor gate to an area of the transistor gate.

6. The layout verification method according to claim 2, wherein:

the antenna value calculation step is to calculate the antenna value based on the antenna ratio in consideration of an alleviation effect with which the antenna effect will be alleviated in accordance with a position where a diode formed out of a diffusion layer is connected to the transistor gate.

7. The layout verification method according to claim 2, wherein:

the antenna value calculation step is to calculate the antenna value based on the antenna ratio in consideration of an alleviation effect with which the antenna effect will be alleviated in accordance with which is formed, a diode or a substrate contact, out of a diffusion layer to which the wiring directly connected to the transistor gate in one end is connected in the other end.

8. The layout verification method according to claim 2, wherein:

the antenna value calculation step is to calculate the antenna value based on the antenna ratio in consideration of a fluctuation in accordance with the antenna effect alleviation effect of the diode due to a light shielding effect of a higher-layer wiring conductor on the diode.

9. The layout verification method according to claim 4, wherein:

the indirect damage includes a component of an antenna effect given to a gate portion on the transistor due to a wiring conductor connected to source and drain terminals of the transistor.

10. The layout verification method according to claim 2, wherein:

the antenna value calculation step includes a step of calculating an antenna value in consideration of fluctuating components based on an antenna effect alleviation effect due to an area of a diffusion layer connected to the transistor gate via wiring in order to take measures against the antenna effect.

11. A method for designing a semiconductor integrated circuit using a layout verification method according to claim 1, comprising the step of:

reducing a result of layout verification based on the antenna value obtained in the layout verification method, to a characteristic fluctuating value of the semiconductor integrated circuit.

12. A method for analyzing deterioration of a semiconductor integrated circuit using a layout verification method according to claim 1, wherein:

deterioration information is generated from a result of verification obtained in the layout verification method, and layout information, in consideration of a difference in deterioration characteristic depending on a kind and a shape of a device and a relationship of connection with wiring.

13. The method for analyzing deterioration of a semiconductor integrated circuit according to claim 12, wherein:

deterioration information is obtained from a characteristic of increase of a leak current of an MOS device with increase of the antenna value.

14. The method for analyzing deterioration of a semiconductor integrated circuit according to claim 12, wherein:

deterioration information is output based on a characteristic of lowering of a voltage switching speed of an MOS device with increase of the antenna value.

15. The method for analyzing deterioration of a semiconductor integrated circuit according to claim 12, wherein:

deterioration information is output based on a characteristic of a change in resistance value of an element suffering the plasma charging damage with increase of the antenna value.

16. The method for analyzing deterioration of a semiconductor integrated circuit according to claim 12, wherein:

deterioration information is output based on a characteristic of a change in capacitance value of an element suffering the plasma charging damage with increase of the antenna value.

17. The method for analyzing deterioration of a semiconductor integrated circuit according to claim 12, wherein:

deterioration information is output based on a characteristic of increase of probability of failure in operation due to a breakdown of a semiconductor element with increase of the antenna value.

* * * * *